United States Patent [19]

Traa

[11] Patent Number: 4,797,586
[45] Date of Patent: Jan. 10, 1989

[54] CONTROLLABLE DELAY CIRCUIT

[75] Inventor: Einar O. Traa, Portland, Oreg.

[73] Assignee: Tektronix, Inc., Beaverton, Oreg.

[21] Appl. No.: 125,023

[22] Filed: Nov. 25, 1987

[51] Int. Cl.$^4$ .......................... H03K 5/13; H03K 17/28
[52] U.S. Cl. ..................................... 307/603; 307/608; 328/55
[58] Field of Search ............... 307/602, 603, 605, 606, 307/608, 494, 243; 328/55, 56; 330/278–281

[56] References Cited

U.S. PATENT DOCUMENTS

| | | | |
|---|---|---|---|
| 3,148,336 | 9/1964 | Milford | 330/280 |
| 3,292,110 | 12/1966 | Becker et al. | 307/606 |
| 3,778,543 | 12/1973 | Lowry | 328/55 |
| 4,434,438 | 2/1984 | Rzeszewski | 333/166 |
| 4,675,562 | 6/1987 | Herlein et al. | 328/55 |

Primary Examiner—Stanley D. Miller
Assistant Examiner—Timothy P. Callahan
Attorney, Agent, or Firm—Daniel J. Bedell; Robert S. Hulse

[57] ABSTRACT

A delay circuit generates an output signal that changes state in adjustably delayed response to a state change in an input signal, the delay being adjusted by a control signal. A series of buffers produces a plurality of delayed signals that change state at different times in response to state changes in the input signal. Amplifiers amplify the input and each delayed signal to produce output currents that are summed to provide a load current through load resistors, thereby providing the output voltage across the load resistors. The gain of each amplifier is adjusted in accordance with the control signal such that at least one and not more than two of the amplifiers have non-zero gain. The delay provided by the delay circuit is determined by the relative gains of the amplifiers.

13 Claims, 5 Drawing Sheets

CONTROLLABLE DELAY CIRCUIT

BACKGROUND OF THE INVENTION

The present invention relates to delay circuits and particularly to variable delay circuits for high frequency signals.

Synchronous logic circuits require that logic signals to which they respond change state at times synchronized to a clock signal. It is sometimes necessary to provide means for adjustably delaying a logic signal prior to transmission to a synchronous logic circuit in order to synchronize that signal with other logic signals produced at locations more remote from the circuit, in order to account for differences in the paths that the signals follow. When a synchronous logic circuit is implemented in an integrated circuit, it is preferable for adjustable delay circuits used therewith to be implemented within the same integrated circuit in order to avoid the cost of additional discrete components.

Tapped delay lines have been used to delay logic signals but normally these cannot be implemented within an integrated circuit. A typical delay circuit implemented in integrated circuit form utilizes a cascade of logic gates, each successive gate delaying an input signal by the unit propagation time of a gate. The total delay provided by such a delay circuit is the product of the number of gates in cascade and the unit propagation time. The total delay can then be adjusted by switching logic gates in or out of the cascade. While such delay circuits are capable of adjusting signal delay over a wide range, the delay resolution is limited to the propagation time of one logic gate. State changes in a data signal should occur within a narrow time window during each period of a synchronizing clock, and therefore such state changes must be synchronized with a resolution that is somewhat finer than the period of the clock. However, in a high speed synchronous logic circuit, the propagation time of logic gates may not be much less than the period of the clock signal controlling the circuit, and therefore delay circuits utilizing logic gate cascades may not be suitable.

SUMMARY OF THE INVENTION

In accordance with one aspect of the invention, an adjustable delay circuit includes a first amplifier and a plurality of additional amplifiers, each producing an output current in response to an input voltage, and a plurality of delay buffers, one corresponding to each additional amplifier. The delay buffers are serially coupled with the output of each buffer being provided as input to a next buffer in the series such that a voltage signal applied as input to a first one of the buffers is propagated sequentially through the series of buffers. An input voltage signal to be delayed is applied as the input to the first amplifier and as input to the first buffer of the series. The output of each buffer is also applied as input to the corresponding one of the additional amplifiers. The output currents of the amplifiers are summed to produce a load current directed through resistance to provide a delay circuit output voltage.

The output signal produced by each delay buffer changes state in delayed response to a change in state of its input signal, and the buffers provide matching unit delay times between input and output signal state changes. Thus when the input signal to the first buffer of the series of buffers changes state, its output signal changes state one unit delay time following the change in state of its input signal, and the output signal produced by each successive buffer of the series changes state one unit delay time following the change in state of the output of the preceding buffer of the series. Since the output signal of each buffer is supplied as input to a corresponding one of the amplifiers, the output currents produced by the first and each additional amplifier change state at different times. The delay circuit output voltage is proportional to the load current and changes state when the load current rises above or falls below a predetermined level. Each amplifier has a variable gain, and by appropriately adjusting the gain of each amplifier, the delay between a change in state of the delay circuit input signal and the delay circuit output voltage can be adjusted over a wide range with fine resolution.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

DETAILED DESCRIPTION

Figure 1:
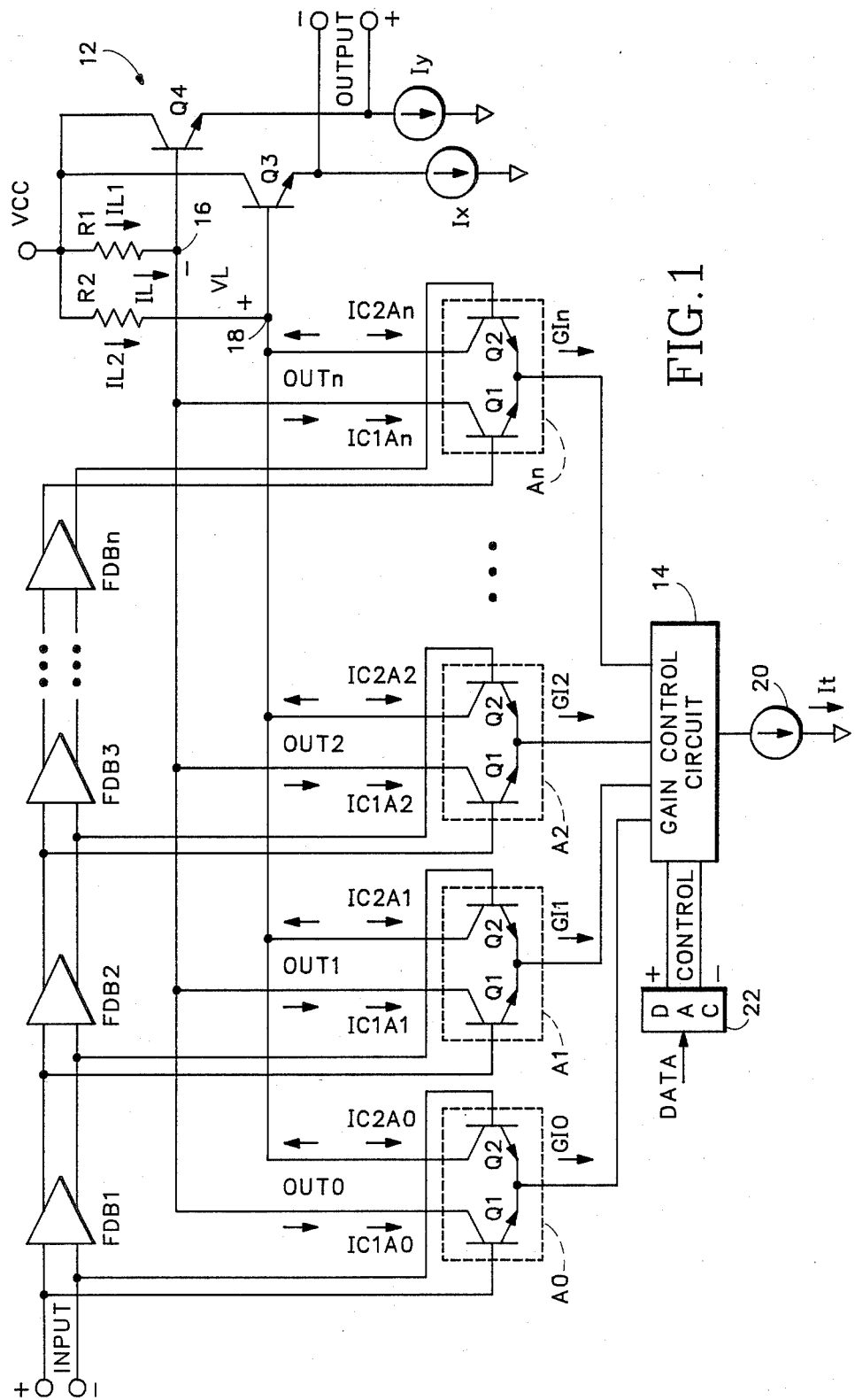
FIG. 1 is a schematic diagram of an adjustable delay circuit in accordance with the present invention.

FIG. 1 is a schematic diagram of an adjustable delay circuit in accordance with the present invention for receiving a differential voltage INPUT signal and providing a differential voltage OUTPUT signal, the OUTPUT signal being adjustably delayed with respect to the INPUT signal in accordance with the magnitude of a differential voltage CONTROL signal. The adjustable delay circuit includes a plurality of serially linked fixed delay buffers FDB1 through FDBn and a plurality of variable gain amplifiers A0 through An. The INPUT signal is applied as input to the first buffer FDB1 and the output of the kth buffer FDBk is provided as input to the (k+1)th buffer FDBk+1. For example, the output of the buffer FDB2 is provided as input to the buffer FDB3. Each buffer FDB1–FDBn produces a differential voltage output signal in response to a differential voltage input signal, its output signal changing state FD seconds after a change in state of its input signal.

Each of the amplifiers A0 through An includes an emitter-coupled transistor pair Q1, Q2 for providing a differential output current at their collectors in response to a differential input voltage applied across their bases. The gain (i.e., the ratio of differential output current to differential input voltage) of each amplifier A0–An is a function of the magnitude of a current signal GI0–GIn, respectively, supplied to the emitters of the transistors Q1 and Q2. The INPUT signal applied as input to buffer FDB1 is also applied as input to amplifier A0, and the outputs of buffers FDB1 through FDBn are supplied as inputs to the amplifiers A1 through An, respectively.

For example, the output of the buffer FDB2 is connected across the bases of transistors Q1 and Q2 of the amplifier A2. Each amplifier Ak provides as its output a differential current signal OUTk of magnitude equal to the difference between the magnitude of the collector currents IC1Ak and IC2Ak of the transistors Q1 and Q2, respectively, of the amplifier Ak. For example, the output of amplifier A2 is a differential current signal OUT2=IC1A2−IC2A2, where IC1A2 and IC2A2 are the collector currents of the transistors Q1 and Q2, respectively, of the amplifier A2.

The collector of each of transistors Q1 of amplifiers A0 through An is connected to a node 16 while the collector of each of transistors Q2 of amplifiers A0 through An is connected to a node 18. A resistor R1 couples node 16 to a voltage source VCC while a resistor R2 couples node 18 to the voltage source VCC. The collector currents IC1A0 through IC1An combine to form a load current IL1 through resistor R1 while the collector currents IC2A0 through IC2An combine to form a load current IL2 through the resistor R2. Thus, amplifiers A0 through An together produce a differential load current IL=IL1−IL2 through resistors R1 and R2, the load current IL being representative of the sum of the amplifier differential output currents OUT0 through OUTn. A differential load voltage signal VL across nodes 16 and 18 is directly proportional to the load current IL.

An output stage amplifier 12 includes a first transistor Q3, a second transistor Q4, and a pair of matching current sources Ix and Iy. The collectors of transistors Q3 and Q4 are connected to voltage source Vcc while the emitters of transistors Q3 and Q4 are coupled to ground through the current sources Ix and Iy, respectively. The base of the transistor Q3 is connected to node 18 and the base of the transistor Q4 is connected to node 16 such that the voltage of the signal VL between nodes 16 and 18 appears across the emitters of the transistors Q3 and Q4 as the OUTPUT signal of the delay circuit.

A delay circuit utilizing two amplifiers and a single delay buffer is described and claimed in the co-pending application of Lazlos Dobos, Ser. No. 125,022, filed concurrently herewith and also entitled ADJUSTABLE DELAY CIRCUIT. Portions of the subject matter of the present application are also set forth in a co-pending U.S. patent application of Hans-Jurg Greub, Ser. No. 084,003, filed Aug. 7, 1987, entitled HIGH SPEED, PARTITIONED REDUCED INSTRUCTION SET COMPUTER.

A gain control circuit 14 produces the currents GI0–GIn which control the gains of amplifiers A0–An, respectively, the gain of each amplifier Ak being proportional to the magnitude of its input control current GIk. The sum of currents GI0–GIn is equal to a current It produced by a current source 20 and supplied as input to gain control circuit 14. Gain control circuit 14 adjusts the magnitudes of currents GI0–GIn in relation to one another in accordance with the differential CONTROL signal applied as input thereto. The CONTROL signal may be produced, for example, by a digital-to-analog converter DAC 22 in response to input data.

Figure 2:
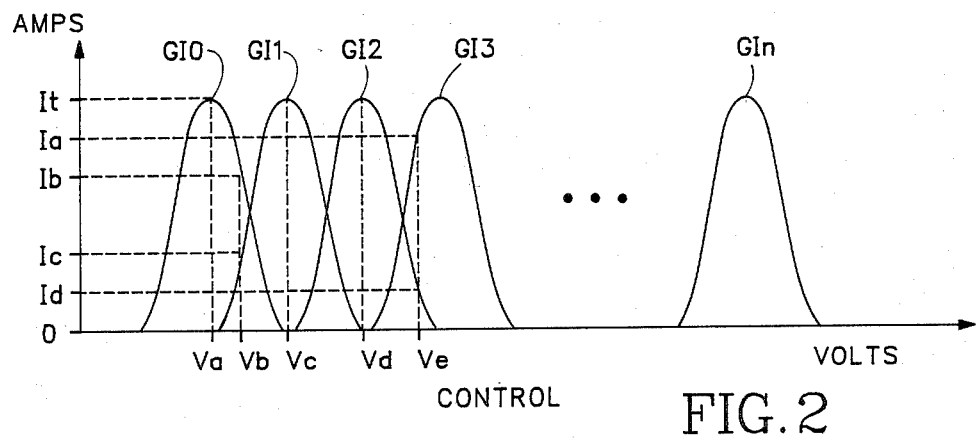
FIG. 2 is a graph of magnitudes of various gain control current signals as a function of the magnitude of a delay control signal.

With reference to FIG. 2, the magnitudes of gain control currents GI0–GIn produces by gain control circuit 14 of FIG. 1 are are plotted as functions of the magnitude of the CONTROL voltage input to the gain control circuit. When the CONTROL voltage is at a level Va, the magnitude of GI0 is It amps and all other currents GI1-GIn are at 0 amps. As the CONTROL voltage is increased to Vb, the magnitude of GI0 is decreased to Ib and the magnitude of GI1 is increased to Ic, the sum of Ib and Ic being equal to It. As the CONTROL voltage is further increased to Vc, gain control current GI1 reaches its peak, equal in magnitude to source 20 current It, current GI0 falls to 0 magnitude, and all other currents GI2-GIn remain at 0 magnitude. When the CONTROL voltage is again increased to Vd, gain control current GI2 rises to It, current GI1 falls to 0 magnitude, and all other currents GI0, and GI3-GIn stay at 0 magnitude. At CONTROL voltage Ve, current GI3 rises to Ia and current GI2 falls to Id, where Ia+Id=It. Thus, the current It is provided as at least one of the control currents GI0 through GIn or is allocated between at most two adjacent ones of the control currents GI0 through GIn. The allocation of the current output of the source 20 of FIG. 1 is controllably apportioned between two adjacent control signals GI0 through GIn by fine adjustment of the CONTROL signal. For example, fine adjustment of the CONTROL signal between the voltages Vc and Vd provides controllable allocation of the current It between the currents GI1 and GI2.

Figure 3:
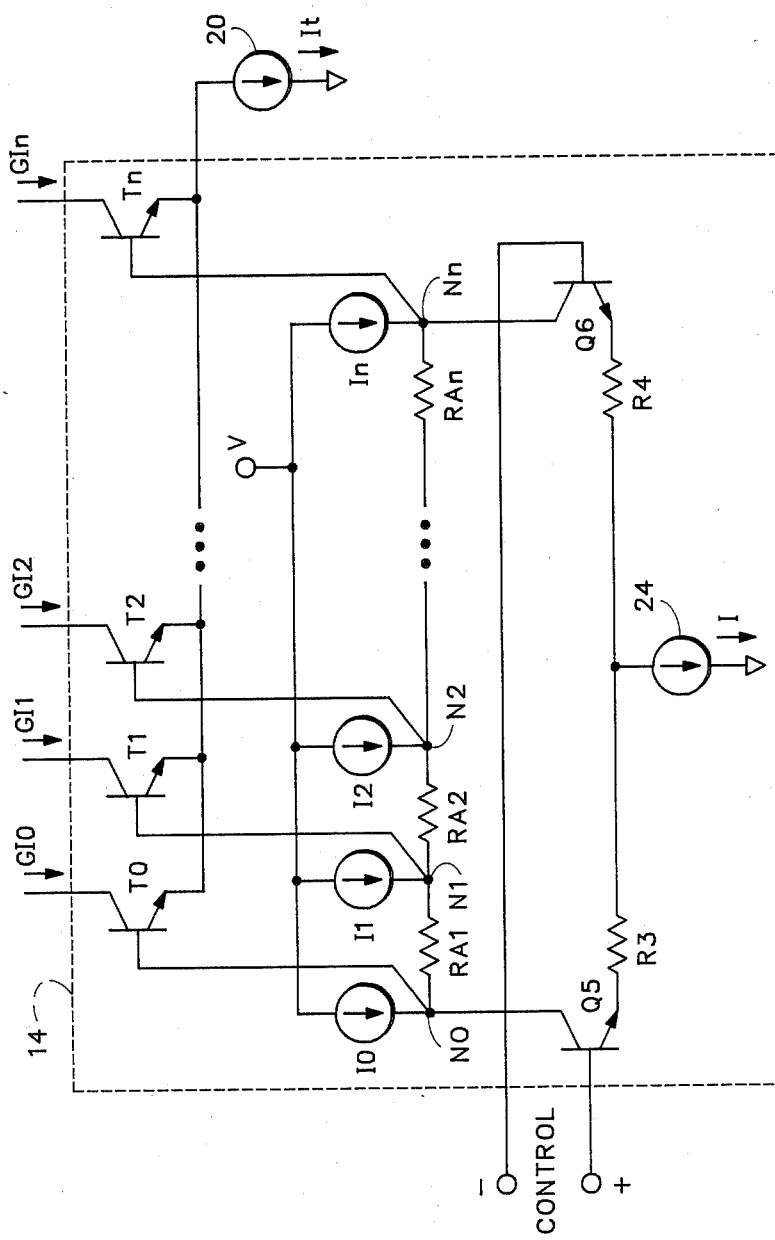
FIG. 3 is a schematic diagram of the gain control circuit of FIG. 1.

FIG. 3 illustrates an embodiment of the gain control circuit 14 of FIG. 1. Circuit 14 includes a set of transistors T0 through Tn, a set of current sources I0 through In, a set of resistors RA1 through RAn, transistors Q5 and Q6, resistors R3 and R4, and a current source 24. Current sources I0-In all produce currents of similar magnitude, and the current output I of the current source 24 is equal to the sum of the current outputs of the current sources I0 through In. The collectors of the transistors T0 through Tn provide the gain control currents GI0 through GIn, respectively. The emitters of the transistors T0 through Tn are connected together and coupled to ground through the current source 20. The resistors RA1 through RAn are connected in series forming nodes No through Nn where node N0 is a first end of the series of resistors, node Nn is a second end of the series, and the nodes N1 through Nn−1 constitute points of connection between the resistors RA1 through RAn, respectively, such that node Nk forms the interconnection between resistors RAk and RAk+1. The collector of the transistor Q5 is connected to node N0, while the collector of transistor Q6 is connected to node Nn. Each of the current sources I through In couples a voltage source V to a corresponding one of the nodes N0 through Nn, respectively, and each of the transistors T0 through Tn has its base connected to a corresponding node N0 through Nn. The emitters of transistors Q5 and Q6 are coupled to the current source 24 through the resistors R3 and R4, respectively, and the CONTROL signal is applied across the bases of transistors Q5 and Q6.

The current output of each current source Ik is supplied to the corresponding node Nk. From each node Nk the current output of source Ik is directed to the right and/or left through the resistor network and into the collector of Q5 and/or into the collector of Q6. If the CONTROL signal is large and negative, substantially all of the current produced by sources I0-In is supplied to the collector of Q6. Conversely, if the CONTROL signal is large and positive, substantially all of the current produced by sources I0-In is supplied to the collector of Q5. At intermediate CONTROL signal levels, a portion of the total current output of sources I0-In is supplied to the collector of Q5 and another portion of the total current is supplied to the collector of Q6. For each given level of CONTROL signal, the node RA0-RAn carrying the smallest amount of current from right to left, or left to right, will have the highest potential, and the node carrying the next smallest amount of current will have the next highest potential. Current sources I0-In and resistors RA1-RAn are sized so that for any given CONTROL signal level, the potential of at least one, and not more than two, of nodes N0-Nn is sufficient to turn on the associated transistor T0-Tn. For example, if node N2 has the highest potential and node N1 has the next highest potential, then only transistors T1 and T2 will be on. As the CONTROL signal becomes more negative, more of the current output of source 12 is directed to the right toward the collector of Q6. The potential of node N1 falls, and the potential of node N2 rises. At some point, transistor T1 turns off and transistor T2 conducts all of current It. As the CONTROL signal becomes still more negative, the potential of node N2 begins to fall and the potential of node N3 (not shown) begins to rise. Transistor T3 (not shown) turns on and begins to conduct a portion of It, and transistor T2 conducts less of It.

Thus, by adjusting the CONTROL signal level a minimum of one and a maximum of two adjacent transistors T0-Tn will turn on, and by finely adjusting the CONTROL signal, one may control the relative proportion of source current It conveyed by the two transistors T0-Tn that are on. As a result, the circuit of FIG. 3 operates in response to a range of CONROL signal voltages to produce a range of control currents GI0-GIn in the manner illustrated in FIG. 2.

Figure 4A:
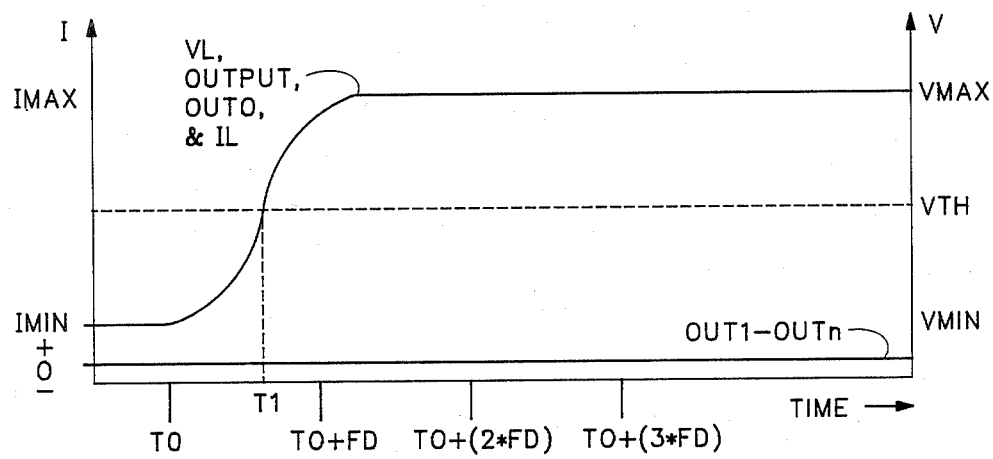
FIGS. 4A through 4B and 5A through 5C are timing diagrams illustrating operation of the circuit of FIG. 1 for various delay control signal values.

FIGS. 4A through 4E illustrate operation of the delay circuit for the CONTROL signal voltages Va through Ve depicted in FIG. 2. In each case the INPUT signal rises from a first voltage to a second voltage at a time T0. FIG. 4A illustrates the relationship between load signal IL and amplifier output currents OUT0 through OUTn when the CONTROL signal has magnitude Va of FIG. 2 and the amplifier A0 receives all of the current output of current source 20 by way of the gain control current GI0. In response to the transition in the INPUT signal at time T0, the differential output current OUT0 of the amplifier A0 makes a transition from a first current IMIN to a second current IMAX beginning at time T0. Because the gain control current GI0 is at a maximum It amps, the output range IMAX-IMIN represents the maximum output range for the amplifier A0. The gain control currents GI1 through GIn are at substantially zero amps, and therefore the outputs OUT1 and OUTn remain substantially at zero volts and contribute nothing toward the signal IL. As a result, the load current IL follows the output current OUT0 of the amplifier A0 as it swings from IMIN to IMAX.

Figure 4B:
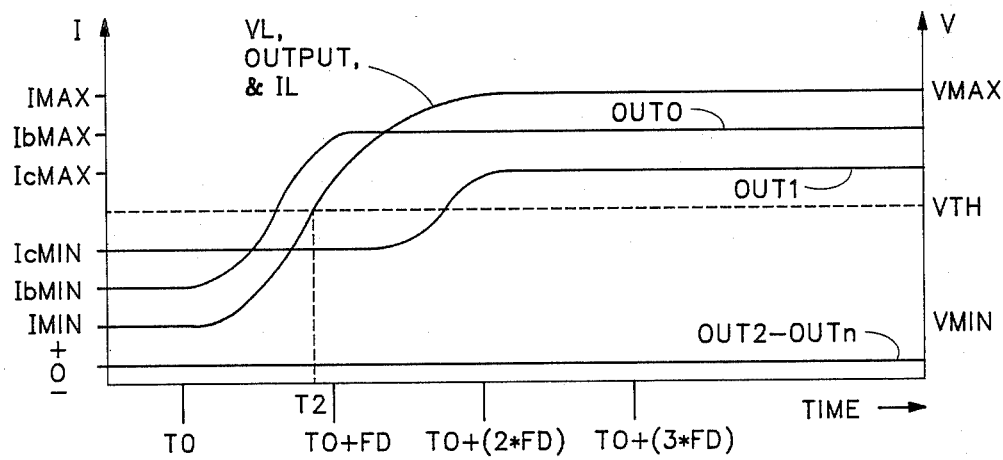

FIG. 4B illustrates relationships between load current signal IL and amplifier output currents OUT0 through OUTn when the CONTROL signal has magnitude Vb of FIG. 2 and the amplifiers A0 and A1 each receive a portion of the current output of current source 20 by way of the gain control currents GI0 and GI1, respectively. In this case, the gain control current GI0 is Ib amps and the output range of the amplifier A0 is scaled by a factor of Ib/It relative to its maximum output range IMAX-IMIN. Similarly, the gain control current GI1 is Ic amps and the gain of the amplifier A1 is scaled by a factor of Ic/It relative to the range IMAX-IMIN. Beginning at the time I0, OUT0 makes a transition from magnitude IbMIN to magnitude IbMAX. The transition in the INPUT signal is presented, by way of delay buffer FDB1, to amplifier A1 at a later time T0+FD. In response, the output OUT1 of the amplifier A1 makes a transition from a current IcMIN to a current IcMAX beginning at the time T0+FD. Because the gain control currents GI2 through GIn are at substantially zero amps, the outputs OUT2 through OUTn remain substantially at zero amps and therefore contribute nothing toward the signal IL. The load current signal IL, being a sum of the outputs OUT0 and OUT1, goes from IMIN to IMAX beginning at the time T0 and finishing after the time (T0+FD).

Figure 4C:
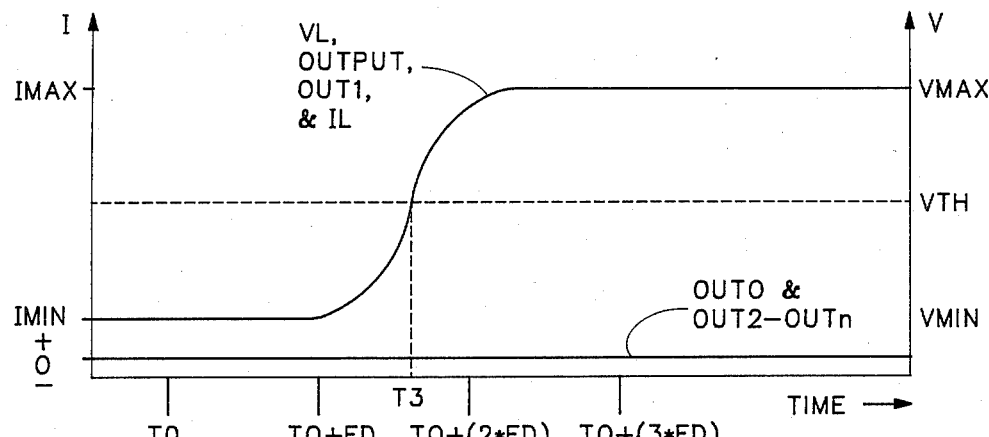

FIG. 4C illustrates relationships between load signal IL and amplifier outputs OUT0 through OUTn when the CONTROL signal equals Vc and amplifier A1 receives all of the current output of the current source 20 by way of the gain control current GI1. The transition in the INPUT signal is presented to the amplifier A1 at the time T0+FD and causes OUT1 to swing from IMIN to IMAX beginning at the time T0+FD. The gain control currents GI0 and GI2 through GIn, being substantially zero amps, maintain outputs OUT0 and OUT2 through OUTn at zero amps. As a result, the current IL follows OUT1 as it goes from IMIN to IMAX.

Figure 4D:
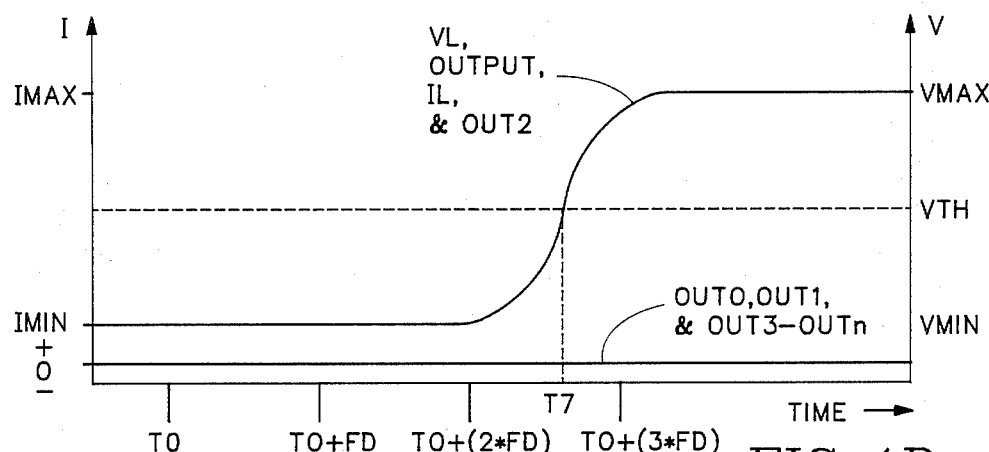

FIG. 4D depicts relationships between load signal IL and amplifier outputs OUT0 through OUTn when the CONTROL signal equals Vd and amplifier A2 receives all of the current It by way of gain control current GI2. The amplifier A2 receives the transition in the input signal at the time T0+(2*FD) causing OUT2 to swing from IMIN to IMAX beginning at the time T0+(2*FD). The outputs OUT0, OUT1, and OUT3 through OUTn are held to zero amps by the 0 magnitude gain control currents GI0, GI01 and FI3 through GIn. The signal IL then follows the output OUT2 of the amplifier A2 as it goes from IMIN to IMAX.

Figure 4E:
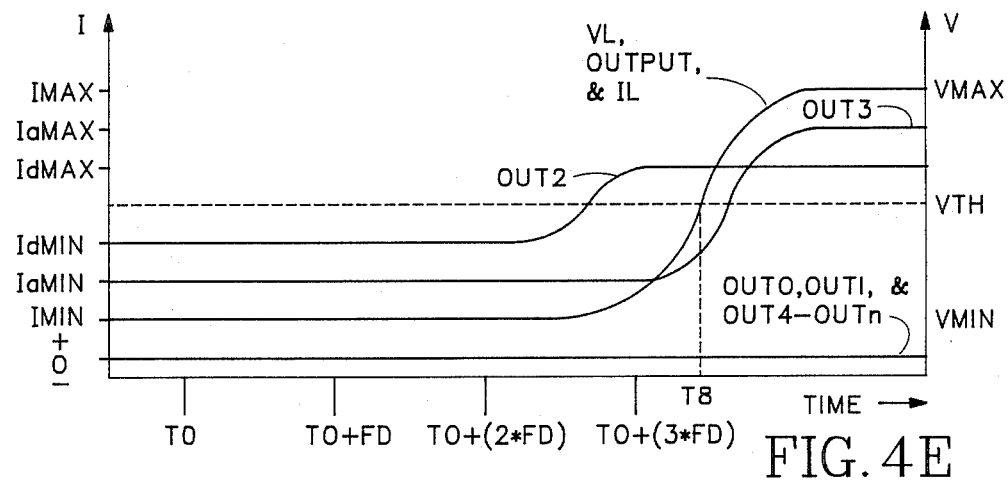

FIG. 4E shows the relationship between load signal IL and amplifier outputs OUT0 through OUTn when the CONTROL signal equals Ve and the amplifiers A2 and A3 each receive a portion of the current It by way of the gain control currents GI2 and GI3, respectively. In this case, the gain control current GI2 is Id amps and the output range of the amplifier A2 is scaled by a factor of Id/It relative to the range IMAX-IMIN. Similarly, the gain control current GI3 is Ia amps and the gain of the amplifier A3 is scaled by a factor of Ia/It relative to the range IMAX-IMIN. When the amplifier A2 receives the transition in the INPUT signal at the time T0+(2*FD), OUT2 makes a transition from a current IdMIN to a current IdMAX. Similarly, OUT3 begins its swing from a current IaMIN to a current IaMAX when the transition in the INPUT signal reaches the amplifier A3 at the time T0+(3*FD). The 0 magnitude gain control currents GI0, GI1 and GI4 through GIn hold the outputs OUT0, OUT1, and OUT4 through OUTn at zero amps. The load current signal IL, being the sum of the outputs OUT2 and OUT3, goes from IMIN to IMAX beginning at the time T0+(2*FD) and finishing after the time T0+(3*FD).

In comparing the FIGS. 4A through 4E it may be appreciated that the load current signal IL is affected by the CONTROL signal. As the CONTROL signal varies from the voltage Va to the voltage Ve, the delay between a transition in the INPUT signal and the beginning of a transition in the load current signal IL increases. In cases where the current It is provided to a single given amplifier, such as in FIGS. 4A, 4C, and 4D, the load current IL sharply rises from IMIN to IMAX beginning at a time corresponding to the time at which the given amplifier receives the transition in the INPUT signal. However, in cases where the current It is allocated between a first given amplifier and an adjacent second given amplifier, such as illustrated in FIGS. 4B and 4E, the manner in which the load current IL increases is determined by the relative contributions of the first and second given amplifiers. If the first given amplifier dominates production of the signal IL, as in FIG. 4B, then the signal IL is steep at the beginning of its response and flatter at the end of its response. Conversely, if the second given amplifier dominates production of the signal IL, as in FIG. 4E, then the signal IL is flatter at the beginning of its swing and steeper at the end of its swing.

Figure 5A:
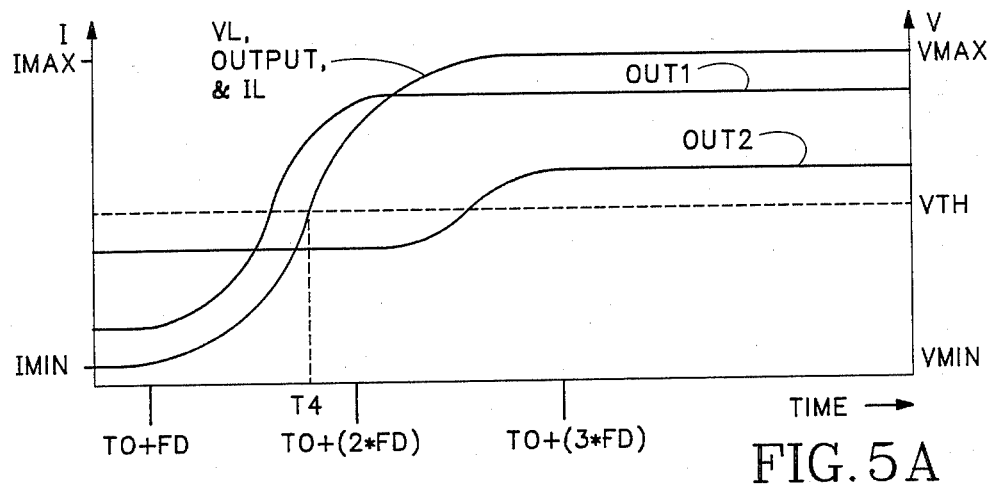
Figure 5B:
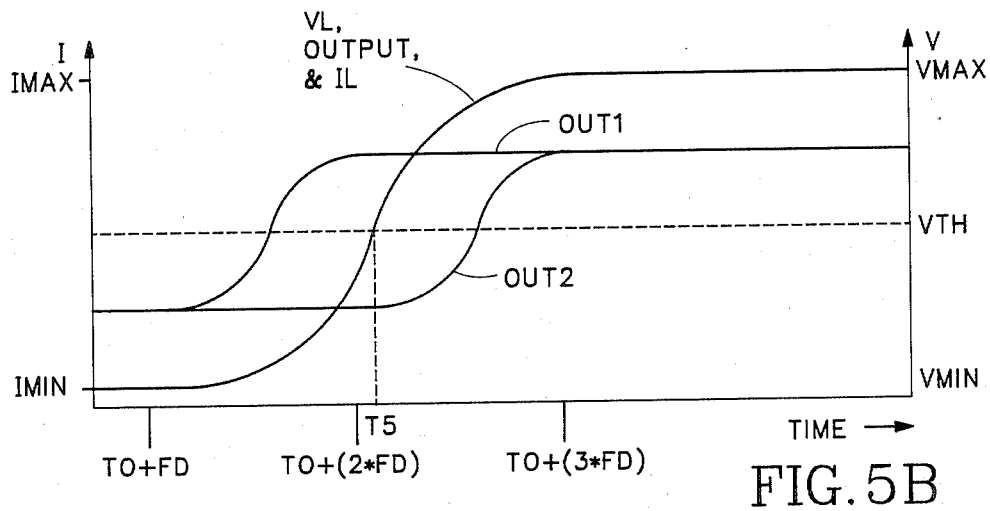
Figure 5C:
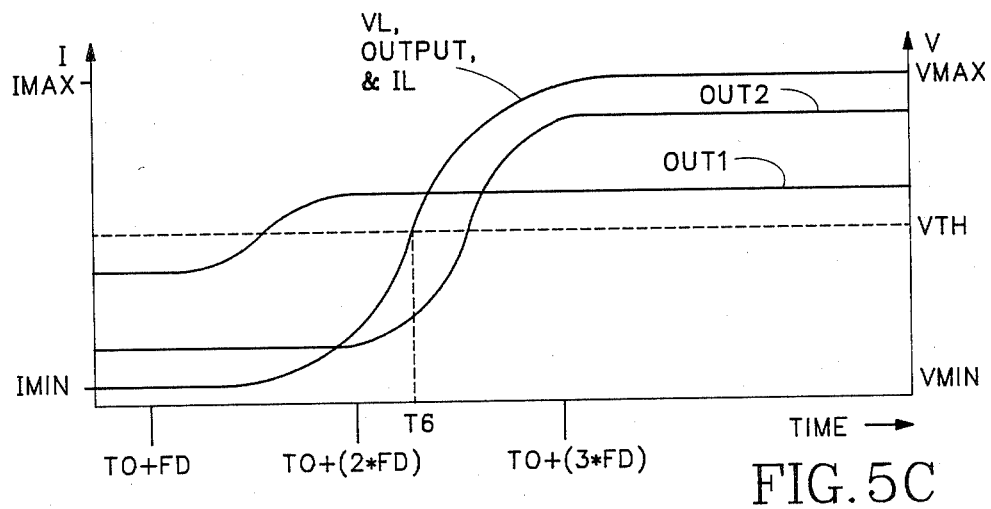

FIGS. 5A through 5C further illustrate the effect of the CONTROL signal on the shape of the load current signal IL where the CONTROL signal varies between the voltages Vc and Vd of FIG. 2. In each case the signal OUT1 begins its response to the INPUT signal transition at the time T0+FD and the signal OUT2 begins its response to the INPUT signal transition at the time T0+2*FD. FIG. 5A depicts a case where the CONTROL signal is such that 75% of the current It is directed through the amplifier 1 and 25% is directed through the amplifier A2. As a result, the output OUT1 is scaled to 75% of the range IMAX-IMIN and the output OUT2 is scaled to 25% of the range IMAX-IMIN. The load current signal IL, being the sum of signals OUT1 and OUT2, varies between IMIN and IMAX and, because the amplifier A1 dominates production of IL, the rise of IL is relatively sharp in the beginning of its swing and relatively flatter at the end of its swing.

In FIG. 5B the CONTROL signal causes 50% of the current It to be directed through the amplifier A1 and 50% to be directed through the amplifier A2. The outputs OUT1 and OUT2 are then scaled to 50% of the range IMAX-IMIN. Because the amplifiers A1 and A2 contribute equally to the signal IL, the response of IL is relatively uniform. In FIG. 5C the CONTROL signal directs 25% of the current It through the amplifier A1 and 75% through the amplifier A2. As a result, the output OUT1 is scaled to 25% of the range IMAX-IMIN and the output OUT2 is scaled to 75% of the range IMAX-IMIN. Because the amplifier A2 dominates production of the load current signal IL, the response of IL is relatively flat in the beginning and more steep at the end.

Variations in load current signal IL between the values IMIN and IMAX produce proportional variations in the differential voltage signal VL between a first voltage VMIN and a second voltage VMAX. The emitter-follower output stage 12 amplifies the signal VL with unity gain to produce the delay circuit OUTPUT voltage signal. Since the value of the CONTROL signal affects the time and shape of the load current signal IL response, the time and shape of the VL and OUTPUT signal responses are similarly affected. A voltage threshold Vth, between VMIN and VMAX, may be taken as a cross-over point at which the OUTPUT signal changes from a first logic state to a second logic state. An external circuit receiving the OUTPUT signal would interpret OUTPUT as, for example, a logic 0 level for voltages below the threshold Vth and a logic 1 level for voltages above the threshold Vth. Because the CONROL signal determines when the OUTPUT signal begins its response and determines whether the OUTPUT signal rises early or rises late in its response to a transition in the INPUT signal, the CONTROL signal magnitude determines when the OUTPUT signal crosses the threshold Vth and, accordingly, when the OUTPUT signal passes from logic 0 to logic 1.

In the FIGS. 4A-4E and 5A-5C, the curve representing the load current signal VL and of the delay circuit OUTPUT voltage, the signals VL and OUTPUT being directly proportional to the signal IL. Thus, the FIGS. 4A-4E and 5A-5C also plot the rise of the OUTPUT signal for various CONTROL signal values and indicate a delay provided between the rising edge of the INPUT signal, at the time T0, and the transition of the OUTPUT signal as it rises above the threshold VTH.

In FIG. 4A, when the control signal is at Va, the OUTPUT signal rises sharply at the time T0 and crosses the voltage VTH at a time T1 to provide a delay of T1−T0 seconds between the state transition in the INPUT signal and a corresponding state transition in the OUTPUT signal. Because the INPUT signal is applied directly to the amplifier A1, there being no intervening delay buffer, the delay T1−T0 represents the minimum delay provided by the delay circuit. In FIG. 4B, the OUTPUT signal rises to cross the threshold VTH at a time T2, later than the time T1, to provide a delay of T2−T0 seconds. In FIG. 4C, the CONTROL voltage Vc causes the OUTPUT signal to cross VTH at a time T3, later than the time T2. In the FIGS. 5A, 5B, and 5C, when the CONTROL signal voltage is varied between Vc and Vd, the OUTUT signal crosses the voltage VTH at successively later times T4, T5, and T6. In FIG. 4D the control voltage Vd causes the OUTPUT signal to cross VTH at a time T7, later than T6. Finally, as illustrated in FIG. 4E, at the CONTROL signal voltage Ve the OUTPUT signal crosses VTH at a time T8, later than T7. At a CONTROL signal voltage wherein all of the current It is provided as the gain control current GIn, the delay between a transition in the INPUT signal and a transition in the OUTPUT signal through VTH is maximized at a time TMAX, the transition in the INPUT signal being delayed by all of the delay buffers FDB1 through FDBn before reaching the amplifier An, the only amplifier then contributing toward production of the load current IL. By fine adjustment of the CONTROL signal, any delay time between the minimum delay of T1−T0 and the maximum delay of TMAX−T0 is provided by the delay circuit.

FIGS. 4A-4E and 5A-5C illustrate circuit behavior when the INPUT signal makes a positive going or rising edge transition. In the case of a negative going or falling edge transition in the INPUT signal, the OUTPUT signal makes a transition from VMAX to VMIN. For a given CONTROL voltage magnitude, the delay between the falling edge of the INPUT signal and a subsequent falling of the OUTPUT signal below the threshold VTH corresponds to the delay time between the rising edge of the INPUT signal and subsequent rise of the OUTPUT signal above the threshold VTH. For example, if the CONTROL signal is such that approximately 75% of the current It of is directed through the amplifier A1 and approximately 25% is directed through the amplifier A2, as is the case of FIG. 5A, then a delay time of T4−T0 will transpire between the falling edge of the INPUT signal and the time at which OUTPUT passes from above VTH to below VTH.

In reference to FIGS. 1, 4A-4E, and 5A-5C, the IL signal should make a continuously increasing transition between IMIN and IMAX to establish a continuous range of available delay times and to avoid an ambiguous condition where the OUTPUT signal remains for a time at or near the threshold voltage VTH. To insure a continuously increasing transition in the IL signal between IMIN and IMAX, a given amplifier Ak should not complete its response to a state change in its input signal until after amplifier Ak+1 has begun its response to the state change in its input signal. For example, the amplifier A1 should not complete its response before the amplifier A2 begins its response. Otherwise, if the amplifier Ak were to complete its response before the amplifier Ak+1 began its response, the IL signal would follow the output OUTk of amplifier Ak to an intermediate level beween IMIN and IMAX and remain at that intermediate level until amplifier Ak+1 began its response. In such case, the OUTPUT signal rises rapidly during the response of the amplifier Ak and during the rsponse of the amplifier Ak+1, but rises very slowly during an intervening period. Further, if the OUTPUT signal is near the threshold VTH during the intervening period, the OUTPUT signal could cross VTH at any time during that period due to noise in the circuit and the "delay time" of the circuit would be unpredictable. Thus, the signal propagation time of the amplifiers A0 through An should be greater than FD seconds, the signal propagation time of the fixed delay buffers FDB1 through FDBn, so that each amplifier can begin its response before the preceding amplifier completes its response. As used herein, the "signal propagation time" of a device may be taken as the rise time of the device from 10% of its output to 90% of its output for a given change in input voltage level.

While the INPUT signal and OUTPUT signal state changes have been shown as a transition from a first positive voltage to a second positive voltage, it is understood that high and low logic levels represented by such transitions are presented for illustration and are not essential to proper operation of the described circuit. For example, positive to negative and negative to positive transitions may be employed to represent transitions between a first logic level and a second logic level. A circuit interpreting the OUTPUT signal may take a threshold voltage between the positive and negative voltages in order to detect a transition between logic 1 and logic 0; there is no requirement that the threshold differential be a positive voltage differential.

Thus, it may be seen that by adjusting the CONTROL signal, the time at which the OUTPUT signal changes state (i.e., crosses Vth) in response to a change in state of the INPUT signal at T0 can be adjusted to any value between T1–T0 and TMAX. Accordingly, the delay between a change in state of the INPUT and OUTPUT signals can be adjusted with a high degree of resolution limited only by the resolution with which the CONTROL signal may be adjusted. The delay circuit of the present invention requires few passive circuit elements, and may therefore be efficiently incorporated into an integrated circuit without requiring excessive circuit area.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method utilizing a first and at least two additional amplifiers to provide a delayed output signal that changes state in delayed response to an input signal, the method comprising the steps of:
    generating a plurality of delayed signals, each corresponding to a separate one of said additional amplifiers, said delayed signals changing state at differing times in delayed response to a change in state of said input signal;
    amplifying said input signal using said first amplifier to produce a first amplifier output, said first amplifier having adjustable gain through a range of amplification;
    amplifying said delayed signals using their corresponding additional amplifiers to produce additional amplifier outputs, said additional amplifiers having adjustable gain through a range of amplification; and
    combining said first and additional amplifier outputs to produce said output signal.

2. A method according to claim1, wherein the step of combining said first and additional amplifier outputs comprises the step of summing the first and additional amplifier outputs.

3. A method utilizing a first and at least two additional amplifiers to provide a delayed output signal that changes state in adjustably delayed response to an input signal, said first and additional amplifiers having adjustable gains, the method comprising the steps of:
    delaying the input signal to produce at least two delayed signals, each delayed signal corresponding to a separate one of said additional amplifiers;
    amplifying said input signal using said first amplifier to produce a first amplifier output, said first amplifier having variable gain through a range of amplification;
    amplifying said delayed signals using their corresponding additional amplifiers to produce additional amplifier outputs, said additional amplifiers having variable gain through a range of amplification;
    combining said first and additional amplifier outputs to produce said delayed output signal; and
    adjusting a delay between a change in state in the input signal and a change in state in the output signal by adjusting the gain of at least one of the first and additional amplifiers.

4. A method according to claim 3, wherein the step of adjusting a delay comprises:
    adjusting at least one and not more than two of said first and additional amplifiers for non-zero gain; and
    adjusting all others of said first and additional amplifiers for zero gain.

5. A method according to claim 3, wherein the step of combining said first and additional amplifier outputs comprises the step of summing the first and additional amplifier outputs.

6. A delay circuit for producing an output signal that changes state in delayed response to a change in state of an input signal, the delay circuit comprising:
    means for providing a plurality of delayed signals that change state at differeing times in delayed response to a change in state in the input signal;
    first amplification means for receiving the input signal as input and providing a first amplifier output, said first amplification means having variable gain through a range of amplification;

a plurality of additional amplification means, each corresponding to a separate one of said plurality of delayed signals, each additional amplification means receiving its corresponding delayed signal as input and providing a separate additional amplifier output, said additional amplification means having variable gain through a range of amplification; and means for combining the first amplifier output and the additional amplifier outputs to provide the output signal.

7. A delay circuit according to claim 6, wherein the means for combining the first amplifier output and the additional amplifier outputs comprises means for summing the first amplifier output and the additional amaplifier outputs.

8. A delay circuit for producing a delay circuit output signal that changes state in adjustably delayed response to a change in state of an input signal, the delay circuit comprising:

means for providing a plurality of delayed signals that change state at differing times in delayed response to a change in state in the input signal;

first amplification means having variable gain through a range of amplification for receiving the input signal as input and providing a first amplifier output;

a plurality of additional amplification means, each having variable gain through a range of amplification, each corresponding to a separate one of said plurality of delayed signals, and each receiving its corresponding delayed signal as input and providing a separate additional amplifier output;

means for controlling the gains of said first amplification means and said additional amplification means; and means for combining the first amplifier output and the additional amplifier outputs to provide the output signal.

9. A delay circuit according to claim 8, wherein the means for combining the first amplifier output and the additional amplifier outputs comprises means for summing the first amplifier output and the additional amplifier outputs to provide the delay circuit output signal.

10. A delay circuit responsive to a control signal for producing a delay circuit output signal that changes state in adjustably delayed response to a change in state of a delay circuit input signal, the delay circuit comprising:

means for providing a plurality of delayed signals that change state at differing times in delayed response to a change in state in the delay circuit input signal;

a first amplifier having a variable gain through a range of amplification controlled by a first gain control current applied thereto, for receiving the delay circuit input signal as input and providing a first differential current output, said first amplifier comprising:

a first transistor having a first terminal, a second terminal, and a third terminal; and a second transistor having a first terminal, a second terminal, and a third terminal, the delay circuit input signal being applied across the first terminal of the first transistor and the first terminal of the second transistor, the second terminal of the first transistor being coupled to the second terminal of the second transistor and receiving said first gain control current, and the first differential current output being provided by the third terminal of the first transistor and the third terminal second transistor;

a plurality of additional amplifiers each corresponding to a separate one of said plurality of delayed signals and each having a variable gain through a range of amplification controlled by a separate one of a plurality of additional gain control currents, each of said additional amplifiers receiving its corresponding delayed signal as input and providing a separate differential current additional amplifier output, each of said additional amplifiers comprising:

a third transistor having a first terminal, a second terminal, and a third terminal; and a fourth transistor having a first terminal, a second terminal, and a third terminal, the corresponding delayed signal being applied across the first terminal of the third transistor and the first terminal of the fourth transistor, the second terminal of the third transistor being coupled to the second terminal of the fourth transistor and receiving one of said additional gain control currents, and the additional amplifier output signal being provided at the third terminal of the third transistor and the third terminal fourth transistor;

means for supplying said first and additional gain control currents of adjustable magnitude to said first and additional amplifiers in accordance with a magnitude of said control signal; and means for combining the first amplifier output and the additional amplifier outputs to provide the output signal.

11. A delay circuit according to claim 10, wherein said means for supplying said gain control currents comprises:

a first current source for providing a first current; and means for selectively dividing the first current in accordance with said control signal to provide said first gain control current and said plurality of additional gain control currents.

12. A delay circuit according to claim 11, wherein said means for selectively dividing the first current comprises:

a plurality of gain control transistors each corresponding to a separate one of the first and additional gain control currents, each gain control transistor having a first terminal, a second terminal coupled to said first current source, and a third terminal for providing one of said first and additional gain control currents; and means communicating with said gain control transistors for adjusting control voltages at the first terminals of said gain control transistors, said control voltages being adjusted in accordance with the magnitude of said control signal such that at least one and not more than two gain control currents have non-zero magnitudes.

13. A delay circuit according to claim 12, wherein said means for adjusting control voltages comprises:

a plurality of resistors connected in series, each resistor also being connected between the first terminals of a corresponding pair of said gain control transistors;

a plurality of current sources, each connected to the first terminal of a separate one of said gain control transistors; and a control amplifier responsive to said control signal for producing a differential control current supplied to said series of resistors such that said control voltages are developed across said resistors in accordance with the magnitude of said control signal.

* * * * *

UNITED STATES PATENT AND TRADEMARK OFFICE
CERTIFICATE OF CORRECTION

PATENT NO. : 4,797,586
DATED : January 10, 1989
INVENTOR(S) : Einar O. Traa

It is certified that error appears in the above-identified patent and that said Letters Patent is hereby corrected as shown below:

Column 5, line 2, "RAO-RAn" should be --N0-Nn--.

Column 6, line 35, "G101 and F13" should be --G11 and G13--.

Column 9, line 52, "T1-T0" should be --T1--.

Signed and Sealed this

Twenty-first Day of November, 1989

Attest:

JEFFREY M. SAMUELS

*Attesting Officer*     *Acting Commissioner of Patents and Trademarks*